(12) United States Patent
Lai

(10) Patent No.: US 7,808,019 B2
(45) Date of Patent: Oct. 5, 2010

(54) GATE STRUCTURE

(75) Inventor: Su-Chen Lai, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 190 days.

(21) Appl. No.: 12/254,822

(22) Filed: Oct. 20, 2008

(65) Prior Publication Data

US 2009/0039443 A1    Feb. 12, 2009

Related U.S. Application Data

(62) Division of application No. 11/308,369, filed on Mar. 20, 2006, now Pat. No. 7,459,383.

(30) Foreign Application Priority Data

Nov. 9, 2005    (TW)    .............................. 94139231 A

(51) Int. Cl.
*H01L 27/148* (2006.01)
*H01L 29/768* (2006.01)
(52) U.S. Cl. ...................... 257/250; 257/331; 257/388; 438/588

(58) Field of Classification Search .................. 257/250, 257/331, 388, E21.2, E21.434; 438/588
See application file for complete search history.

(56) References Cited

U.S. PATENT DOCUMENTS

| 6,504,210 B1 * | 1/2003 | Divakaruni et al. | ......... 257/344 |
| 7,595,248 B2 * | 9/2009 | Hattendorf et al. | .......... 438/302 |

* cited by examiner

*Primary Examiner*—Theresa T Doan
(74) *Attorney, Agent, or Firm*—Jianq Chyun IP Office

(57) ABSTRACT

A gate structure includes a substrate, a gate dielectric layer, a first conductive layer, a second conductive layer, a cap layer and a first insulating spacer. The gate dielectric layer is disposed on the substrate. The first conductive layer is disposed on the gate dielectric layer and has an opening. A part of the second conductive layer is disposed in the opening. The second conductive layer has an extrusion that protrudes above the opening of the first conductive layer. The extrusion has a cross-sectional width less than the width of the second conductive layer inside the opening. The cap layer is disposed on the extrusion. The first insulating spacer is disposed on a part of the first conductive layer and covers the sidewalls of the extrusion. The inclusion of the extrusion in the second conductive layer decreases the resistance of the gate structure and promotes the efficiency of the device.

7 Claims, 6 Drawing Sheets

GATE STRUCTURE

CROSS-REFERENCE TO RELATED APPLICATION

This application is a divisional of an application Ser. No. 11/308,369, filed on Mar. 20, 2006, now allowed, which claims the priority benefit of Taiwan application serial no. 94139231, filed on Nov. 9, 2005. The entirety of each of the above-mentioned patent applications is hereby incorporated by reference herein and made a part of this specification.

BACKGROUND OF THE INVENTION

1. Field of the Invention

The present invention relates to a semiconductor device structure. More particularly, the present invention relates to a gate structure.

2. Description of the Related Art

Because of the high level of integration of deep sub-micron integrated circuits, many device features including line width, contact area and junction depth have been substantially reduced. To increase the performance of the devices despite of such reduction, lowering the resistance and reducing signal delay due to resistance and capacitance (RC-delay) has become immensely important. Thus, in the fabrication of semiconductor devices, a refractory metal silicide layer is frequently formed on polysilicon gate. The polysilicon layer and the refractory metal silicide layer are commonly referred to as a polycide gate. Among various types of refractory metal silicides, the most commonly used metal silicide is tungsten silicide ($WSi_x$). A gate structure comprising a polysilicon layer and a tungsten silicide layer is called a "tungsten polycide gate".

FIG. 1 is a schematic cross-sectional view of a conventional gate structure. In a conventional tungsten polycide gate structure as shown in FIG. 1, a gate dielectric layer 102, a polysilicon layer 104, a tungsten silicide layer 106 and a cap layer 108 are sequentially deposited over a substrate 100 to form a gate structure 110. Then, a thermal oxidation process is performed to form a silicon oxide liner layer 112 on the sidewalls of the gate structure 110. However, in the high-temperature thermal process, a phase transition of the tungsten silicide layer 106 often leads to the lateral extrusions 114. With the continual reduction in the line width of a device, the extrusions 114 may lead to a partial short-circuit between the gate and the conductive part of a contact in a back end processing stage. Ultimately, the performance of the device will be affected.

To prevent a conventional tungsten polycide gate from any extrusions, another conventional technique for forming the gate structure that includes forming an opening in the polysilicon layer and filling tungsten silicide material into the opening has been developed.

FIGS. 2A through 2C are schematic cross-sectional views showing the steps for fabricating a gate structure according to another conventional method. As shown in FIG. 2A, a sacrificial layer 202 and an insulating layer 204 are sequentially formed over a substrate 200. Then, an opening 206 is formed in the insulating layer 204. Thereafter, a gate dielectric layer 208 is formed over the substrate 200 at the bottom of the opening 206.

As shown in FIG. 2B, a polysilicon layer 210 is formed over the substrate 200 without completely filling the opening 206. Then, a tungsten silicide layer 212 is formed over the substrate 200, at least filling the opening 206. After that, part of the polysilicon 210 and the tungsten silicide layer 212 is removed until the surface of the insulating layer 204 is exposed.

As shown in FIG. 2C, the polysilicon 210 and the tungsten silicide layer 212 in the opening 206 is etched back to a certain depth. Then, a cap layer 214 is deposited to fill the opening 206 again. Thereafter, the insulating layer 204 and the sacrificial layer 202 on the substrate 200 is removed to form a gate structure 216. The gate structure 216 comprises the gate dielectric layer 208, the polysilicon layer 210, the tungsten silicide layer 212 and the cap layer 214. Next, a thermal processing operation is performed to form a silicon oxide liner layer 218 on the sidewalls of the polysilicon layer 210 and produce an oxide layer 220 on the substrate 200 at the same time.

Since the cross-sectional area of a tungsten silicide layer 21 is related to the resistance of the gate, increasing the cross-sectional area of the tungsten silicide layer 212 can decrease the resistance of the gate and enhance the performance of the device.

SUMMARY OF THE INVENTION

Accordingly, the present invention is directed to a gate structure with a lower gate resistance.

The present invention is further directed to a method of fabricating a gate structure that can increase the processing window of subsequent fabrication process.

To achieve these and other advantages and in accordance with the purpose of the invention, as embodied and broadly described herein, the present invention provides a gate structure. The gate structure comprises a substrate, a gate dielectric layer, a first conductive layer, a second conductive layer, a cap layer and a first insulating spacer. The gate dielectric layer is disposed on the substrate. The first conductive layer is disposed on the gate dielectric layer and has an opening. Part of the second conductive layer is disposed in the opening of the first conductive layer and has an extrusion that protrudes above the opening of the first conductive layer. The extrusion has a cross-sectional width less than the width of the second conductive layer inside the opening. The cap layer is disposed above the extrusion. The first insulating spacer is disposed on part of the first conductive layer and covers the sidewall on two sides of the extrusion.

According to the aforementioned gate structure in one embodiment of the present invention, the first conductive layer may be fabricated using an adhesive material that has a good bonding capability with the gate dielectric layer including doped polysilicon, for example.

According to the aforementioned gate structure in one embodiment of the present invention, the second conductive layer may be fabricated using a metal silicide including tungsten silicide, for example.

According to the aforementioned gate structure in one embodiment of the present invention, the cap layer may be fabricated using silicon nitride, silicon oxide, silicon oxynitride or any combination of the above materials, for example.

According to the aforementioned gate structure in one embodiment of the present invention, the first insulating spacers may be fabricated using silicon nitride, for example.

According to the aforementioned gate structure in one embodiment of the present invention, the gate structure further includes a second insulating spacer disposed on the sidewall of the two sides of the first conductive layer. The second insulating spacer may be fabricated using silicon nitride, for example.

In general, the material composition of the cap layer, the first insulating spacer and the second insulating spacer are chosen according to whether they will affect the performance of the device and the adjustment of the selectivity ratio in a subsequent etching process.

The present invention also provides a method of fabricating a gate structure. First, a substrate is provided. Then, a gate dielectric layer is formed over the substrate. Next, a first conductive layer is formed over the gate dielectric layer. Thereafter, an opening is formed in the first conductive layer. After that, a second conductive layer is formed over the first conductive layer. Part of the second conductive layer fills the opening and part of the second conductive layer is disposed on the surface of the first conductive layer outside the opening. Then, a patterned cap layer is formed over the second conductive layer. The cap layer located above the opening has a width smaller than the width of the opening in the first conductive layer. Afterwards, a patterned second conductive layer is formed such that the first conductive layer is exposed. The second conductive layer above the opening has a width smaller than the width of the opening in the first conductive layer. Thereafter, a first insulating spacer is formed on the two sidewalls of the cap layer so that the first insulating spacer and the cap layer cover over the second conductive layer. Then, the first conductive layer not covered by the first insulating spacer is removed.

According to the aforementioned method of fabricating a gate structure in one embodiment of the present invention, the step for patterning the cap layer includes sequentially forming a conformal cap layer and a patterned mask layer over the cap layer. The patterned mask layer has a width above the opening smaller than the width of the opening in the first conductive layer. Then, an anisotropic etching operation of the conformal cap layer is performed. Thereafter, using the patterned mask layer as a mask, a dry etching operation is performed to define and remove part of the second conductive layer so that the patterned second conductive layer is formed. After that, the patterned mask layer is removed. The patterned mask layer includes a patterned photoresist layer.

According to the aforementioned method of fabricating a gate structure in another embodiment of the present invention, the patterned mask layer can be removed after performing the anisotropic etching of the cap layer.

According to the aforementioned method of fabricating a gate structure in one embodiment of the present invention, the steps for forming the first insulating spacer includes forming a conformal first insulating spacer material layer over the substrate and performing an anisotropic etching of the first insulating spacer material layer thereafter. The first insulating spacer material layer is preferably fabricated using silicon nitride.

According to the aforementioned method of fabricating a gate structure in one embodiment of the present invention, after removing the first conductive layer not covered by the first insulating spacer further includes forming a second insulating spacer on the respective sidewalls of the first conductive layer. The method of forming the second insulating spacer includes forming a conformal second insulating spacer material layer over the substrate and performing an anisotropic etching of the second insulating spacer material layer thereafter. The second insulating spacer material layer is preferably fabricated using silicon nitride.

According to the aforementioned method of fabricating a gate structure in one embodiment of the present invention, the first conductive layer is fabricated using doped polysilicon, the second conductive layer is fabricated using metal silicide and the patterned cap layer is fabricated using silicon nitride.

In the present invention, the second conductive layer has an additional extrusion. Therefore, the cross-sectional area of the second conductive layer is increased so that the gate resistance is lowered and overall performance of the device is improved.

Furthermore, the method of fabricating the gate structure can prevent any short circuit resulting from the formation of a lateral extrusion in the second conductive layer.

In addition, aforementioned method of the present invention for fabricating the gate structure provides a larger processing window in the subsequent process of forming a contact.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
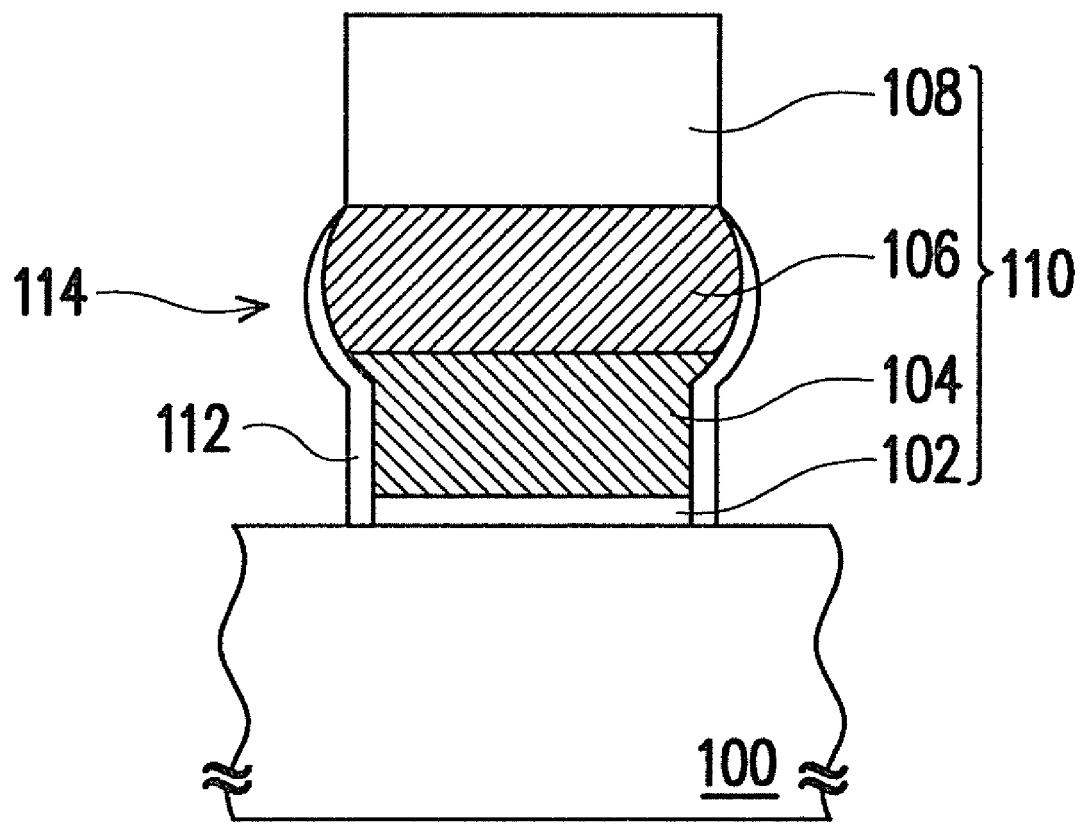
FIG. 1 is a schematic cross-sectional view of a conventional gate structure.
Figure 2A:
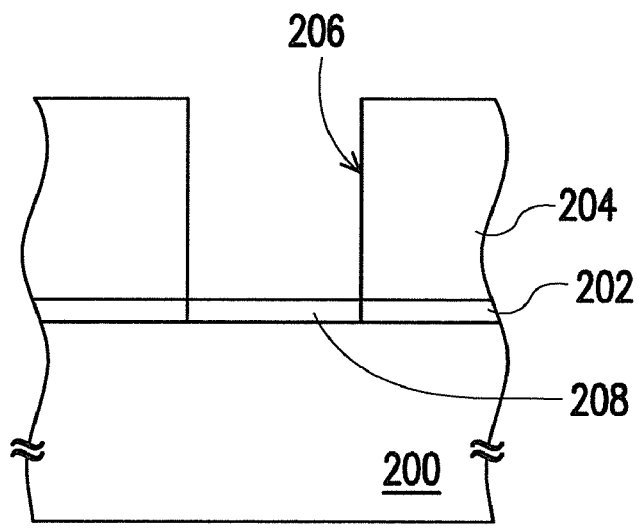
FIGS. 2A through 2C are schematic cross-sectional views showing the steps for fabricating a gate structure according to another conventional method.
Figure 2B:
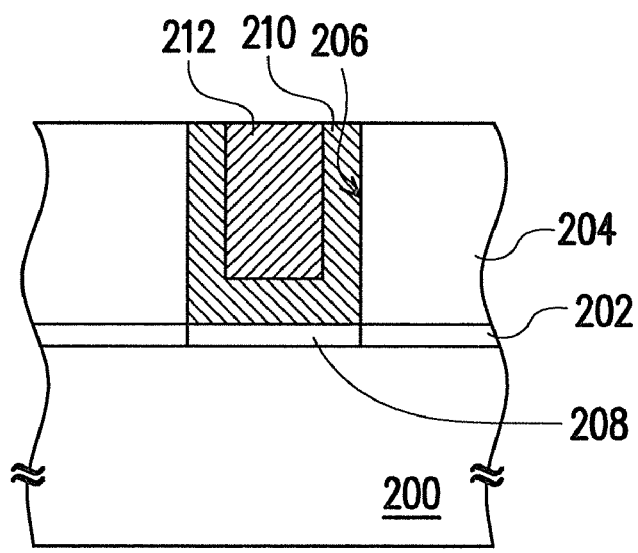
Figure 2C:
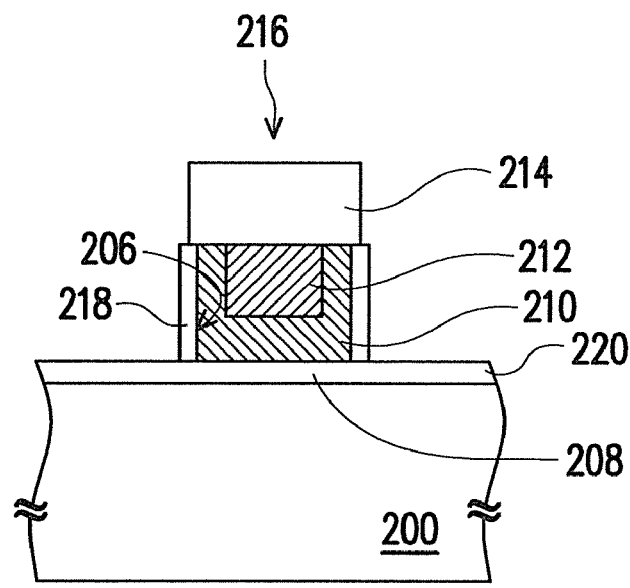

Reference will now be made in detail to the present preferred embodiments of the invention, examples of which are illustrated in the accompanying drawings. Wherever possible, the same reference numbers are used in the drawings and the description to refer to the same or like parts.

Figure 3:
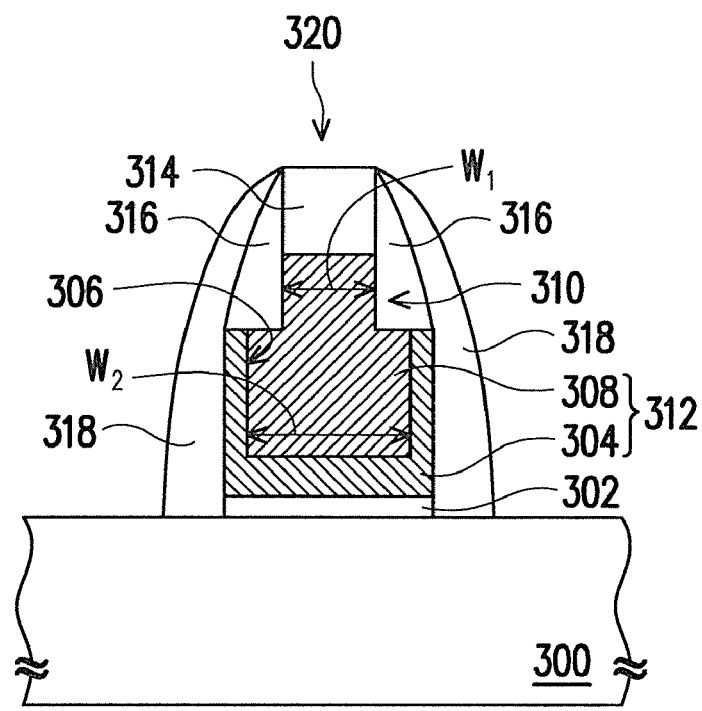
FIG. 3 is a schematic cross-sectional view of a gate structure according to one embodiment of the present invention.

FIG. 3 is a schematic cross-sectional view of a gate structure according to one embodiment of the present invention. As shown in FIG. 3, the gate structure 320 includes a substrate 300, a gate dielectric layer 302, a first conductive layer 304, a second conductive layer 308, a cap layer 314 and a pair of spacers 316.

The gate dielectric layer 302 is disposed on the substrate 300. The gate dielectric layer 302 is fabricated using silicon oxide or any other suitable material, for example.

The first conductive layer 304 is disposed over the gate dielectric layer 302. Furthermore, the first conductive layer 304 has an opening 306. The first conductive layer 304 is fabricated using doped polysilicon or other material that has a good bonding capability with the gate dielectric layer 302, for example.

Part of the second conductive layer 308 is disposed in the opening 306 of the first conductive layer 304. Furthermore, the second conductive layer 308 has an extrusion 310 that protrudes above the opening 306 of the first conductive layer 304. The extrusion 310 has a width W1 smaller than the width W2 of the second conductive layer 308 inside the opening 306. The second conductive layer 308 is fabricated using a metal silicide such as tungsten silicide or any other low resistance material, for example. The aforementioned first conductive layer 304 and the second conductive layer 308 together constitute the gate 312 of the gate structure 320.

The cap layer 314 is disposed on the extrusion 310. The cap layer 314 is fabricated using silicon nitride or any other suitable material, for example.

The insulating spacer 316 is disposed on part of the first conductive layer 304 and the respective sidewalls of the extrusion 310. The insulating spacer 316 is fabricated using silicon nitride or any other suitable material, for example.

In one embodiment, the gate structure 320 further includes another spacer 318 disposed on the respective sidewalls of the first conductive layer 304. The spacer 318 is fabricated using silicon nitride or any other suitable material, for example.

In the present invention, the second conductive layer 308 includes an extrusion 310 so that the cross-sectional area of the second conductive layer 308 is increased. As a result, the resistance of the gate 312 is lowered and the performance of the device is improved. In addition, the extrusion 310 of the second conductive layer 308 has a width smaller than the width of the second conductive layer 308 inside the opening 306. Therefore, after completing the fabrication of the gate structure 320, the processing window of the subsequent process for forming a contact is increased.

Figure 4A:
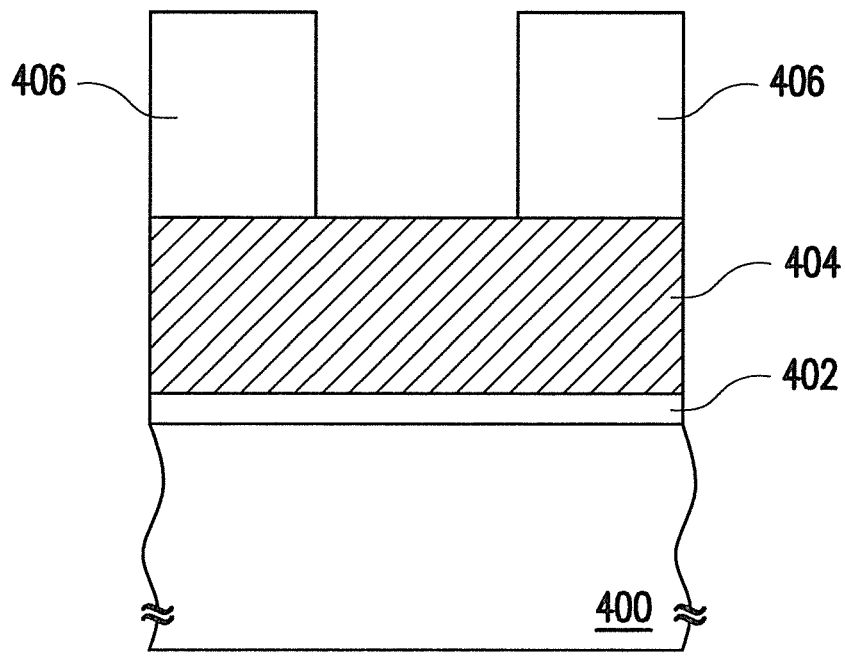
FIGS. 4A through 4E are schematic cross-sectional views showing the steps for fabricating a gate structure according to another embodiment of the present invention.

FIGS. 4A through 4E are schematic cross-sectional views showing the steps for fabricating a gate structure according to another embodiment of the present invention. As shown in FIG. 4A, a dielectric layer 402 is formed over a substrate 400. The method of forming the dielectric layer 402 includes performing a thermal oxidation process, for example. The dielectric layer 420 is used as a gate dielectric layer in a subsequent process.

Thereafter, a first conductive layer 404 is formed over the dielectric layer 402. The first conductive layer 404 is fabricated using doped polysilicon, for example. The method of forming the first conductive layer 404 includes performing a chemical vapor deposition process, for example.

Then, a patterned mask layer 406 is formed over the first conductive layer 404. The patterned mask layer 406 is a patterned photoresist layer, for example.

Figure 4B:
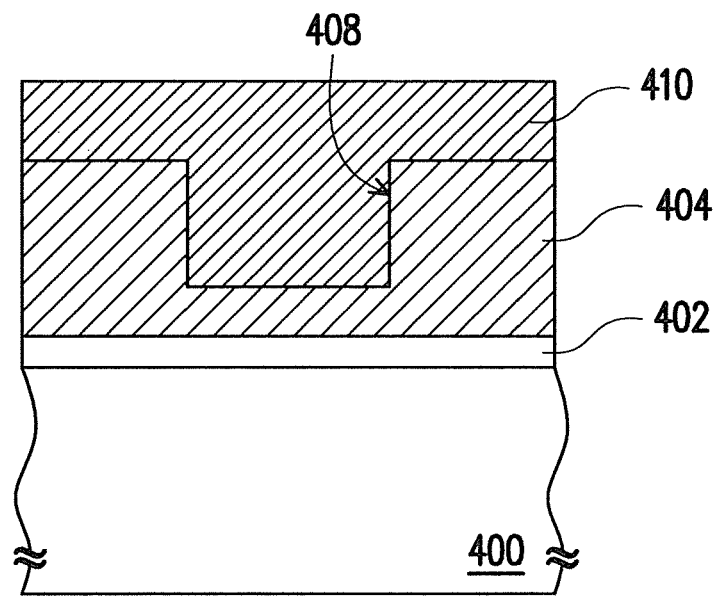

As shown in FIG. 4B, using the patterned mask layer 406 as a mask, the exposed first conductive layer 404 is removed to a certain depth and form an opening 408 in the first conductive layer 404. The method of removing the exposed first conductive layer 404 includes performing a dry etching operation, for example. Thereafter, the patterned mask layer 406 is removed.

Then, a second conductive layer 410 is formed over the first conductive layer 404 to fill the opening 408 completely. The second conductive layer 410 is fabricated using a metal silicide including tungsten silicide or any other suitable material, for example. The method of forming the second conductive layer 410 includes performing a chemical vapor deposition process, for example.

Figure 4C:
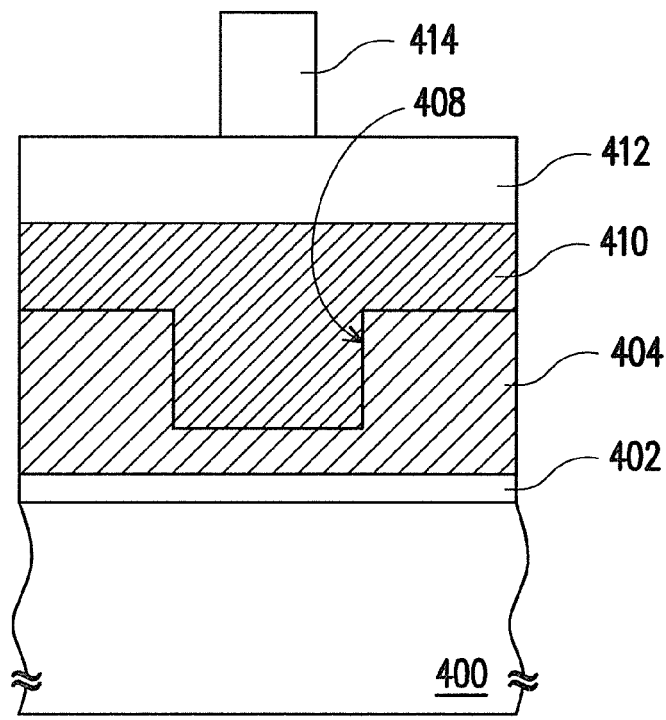

As shown in FIG. 4C, a conformal cap layer 412 is formed over the second conductive layer 410. The cap layer 412 is a silicon nitride layer, for example. The method of forming the cap layer 412 includes performing a chemical vapor deposition process, for example.

Thereafter, a patterned mask layer 414 is formed over the cap layer 412. The patterned mask layer 414 is disposed above the opening 408 such that the boundary of the patterned mask layer 414 located within the boundary of the opening 408. In other words, the width of the patterned mask layer 414 is smaller than the width of the opening 408. The patterned mask layer 414 is a patterned photoresist layer, for example.

Figure 4D:
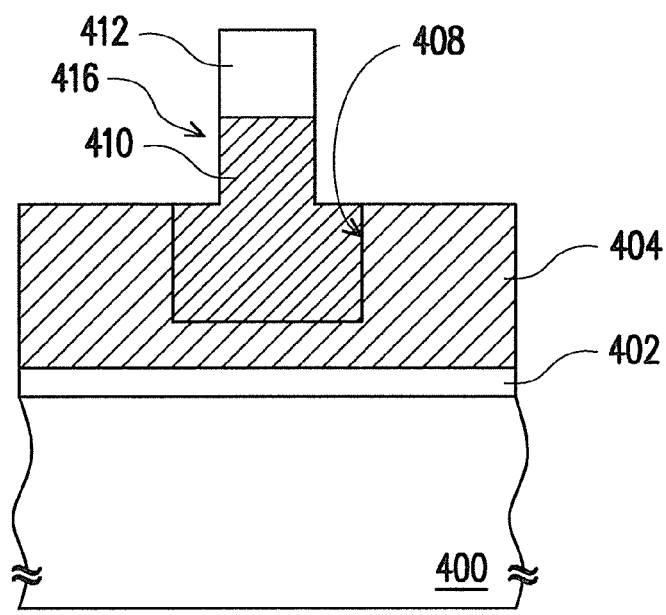

As shown in FIG. 4D, using the patterned mask layer 414 as a mask, part of the cap layer 412 and the second conductive layer 410 are sequentially removed until the conductive layer 404 and part of the conductive layer 410 in the opening 408 are exposed. Hence, an extrusion 416 comprising the remaining portions of the second conductive layer 410 is formed protruding above the opening 408. Part of the cap layer 412 and the second conductive layer 410 are removed by performing an anisotropic etching process such as a dry etching process, for example. After that, the patterned mask layer 414 is removed.

In another embodiment, using the patterned mask layer 414 as a mask, the patterned mask layer 414 is removed immediately after forming the cap layer 412. Then, using the cap layer 412 as a mask, part of the second conductive layer 410 is removed to form the extrusion 416.

It should be noted that the extrusion 416 of the second conductive layer 410 has a width smaller than the width of the second conductive layer 410 inside the opening 408. Therefore, after completing the fabrication of the gate structure, the processing window in the subsequent process of forming a contact is increased.

Figure 4E:
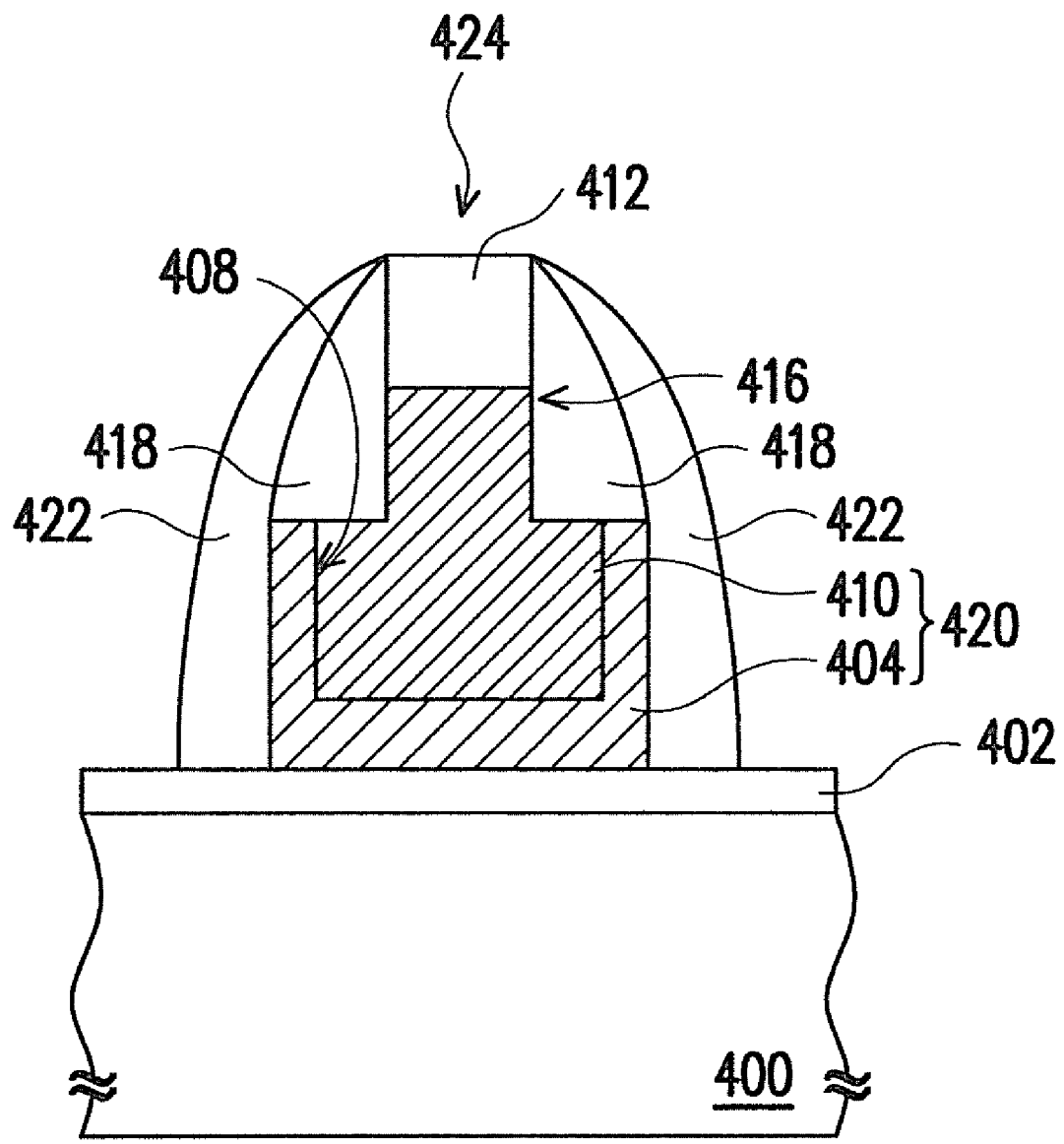

As shown in FIG. 4E, spacers 418 are formed on the respective sidewalls of the cap layer 412. Part of the spacer 418 covers a portion of the first conductive layer 404 and the whole second conductive layer 410. The spacer 418 is fabricated using silicon nitride, for example. The method of forming the spacers 418 includes depositing a conformal insulating spacer material layer (not shown) over the substrate 400 and etching back the insulating spacer material layer thereafter. The etching back process includes performing an anisotropic etching operation, for example.

Thereafter, the first conductive layer 404 not covered by the spacers 418 is removed. The method of removing the first conductive layer 404 includes performing a dry etching operation, for example. The first conductive layer 404 and the second conductive layer 410 together form the gate 420 of the gate structure. It should be noted that the provision of an extrusion 416 in the second conductive layer 410 could increase the cross-sectional area of the gate structure. Hence, the resistance of the gate 420 is lowered and the performance of the device is improved.

In another embodiment, another spacers 422 may also be formed on the respective sidewalls of the first conductive layer 404. The spacers 422 are fabricated using silicon nitride, for example. The method of forming the spacers 422 includes depositing a conformal insulating spacer material layer (not shown) on the substrate 400 and etching back the insulating spacer material layer thereafter.

The substrate 400, the dielectric layer 402, the first conductive layer 404, the second conductive layer 410, the cap layer 412, the spacers 418 and the spacers 422 together form the gate structure 424.

It should be appreciated that the subsequent processes in the fabrication of the semiconductor device such as the steps of forming the source/drain regions, forming the dielectric layer between devices and forming the contacts (not shown) familiar to those skilled in the technology, a detailed description of these processes is omitted. In the present embodiment, protective spacers 418 and 422 are formed over the gate structure 424. Therefore, the conductive portion of subsequently formed contacts will not contact the first conductive layer 404 or the second conductive layer 410 directly and thus the possibility of a short circuit between the contacts and the first conductive layer 404 or the second conductive layer 410 is effectively reduced. In addition, the gate 420 portion of the gate structure 424 has a narrow top and a wider bottom. Hence, the process window for forming contact is increased.

In summary, the advantages of the present invention includes:

1. The second conductive layer in the gate structure has an additional extrusion so that the cross-sectional area is increased. As a result, the gate can have a lower resistance and the device can have an improved performance.
2. The width of the extrusion of the second conductive layer of the gate structure is smaller than the width of the second conductive layer inside the opening. Therefore, after forming the gate structure, the processing window of the subsequent process of forming contacts is increased.
3. In the process of forming the gate structure, lateral extrusion in the second conductive layer as a result of phase changes will not occur. Thus, the possibility of short circuits in the device can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gate structure, comprising:
    a substrate;
    a gate dielectric layer, disposed on the substrate;
    a first conductive layer, disposed on the gate dielectric layer, wherein the first conductive layer has an opening;
    a second conductive layer, with a part thereof, disposed in the opening of the first conductive layer, wherein the second conductive layer has an extrusion protruding above the opening of the first conductive layer such that the width of the extrusion is smaller than the width of the second conductive layer inside the opening;
    a cap layer, disposed over the extrusion; and
    a first insulating spacer, disposed over part of the first conductive layer and over the respective sidewalls of the extrusion.

2. The gate structure of claim 1, wherein a material constituting the first conductive layer includes doped polysilicon.

3. The gate structure of claim 1, wherein a material constituting the second conductive layer includes metal silicide.

4. The gate structure of claim 1, wherein a material constituting the cap layer includes silicon nitride, silicon oxide, silicon oxynitride or any combination of the above.

5. The gate structure of claim 1, wherein a material constituting the first insulating spacer includes silicon nitride.

6. The gate structure of claim 1, wherein the gate structure further includes a second insulating spacer disposed on respective sidewalls of the first conductive layer.

7. The gate structure of claim 6, wherein a material constituting the second insulating spacer includes silicon nitride.

* * * * *